(12) United States Patent
Wilby et al.

(10) Patent No.: US 8,200,353 B2
(45) Date of Patent: Jun. 12, 2012

(54) MEASURING APPARATUS

(75) Inventors: Robert John Wilby, Bristol (GB); Adrian Kiermasz, Bristol (GB)

(73) Assignee: Metryx Limited, Bristol (GB)

( * ) Notice: Subject to any disclaimer, the term of this patent is extended or adjusted under 35 U.S.C. 154(b) by 197 days.

(21) Appl. No.: 12/530,498

(22) PCT Filed: Mar. 4, 2008

(86) PCT No.: PCT/GB2008/000734
§ 371 (c)(1),
(2), (4) Date: Jan. 28, 2010

(87) PCT Pub. No.: WO2008/110746
PCT Pub. Date: Sep. 18, 2008

(65) Prior Publication Data
US 2010/0147078 A1    Jun. 17, 2010

(30) Foreign Application Priority Data
Mar. 14, 2007    (GB) .................................. 0704936.4

(51) Int. Cl.
*G01N 29/00* (2006.01)
*G06F 19/00* (2011.01)

(52) U.S. Cl. ............. 700/110; 700/121; 702/56; 702/82

(58) Field of Classification Search .................. 700/110, 700/121; 702/56, 82
See application file for complete search history.

(56) References Cited

U.S. PATENT DOCUMENTS

| | | | |
|---|---|---|---|
| 6,654,659 B1 | 11/2003 | Lyons et al. | |
| 7,131,890 B1 | 11/2006 | Molnar | |
| 7,232,715 B2 | 6/2007 | Arao et al. | |
| 2004/0182311 A1 | 9/2004 | Hanazaki | |
| 2010/0138027 A1* | 6/2010 | Ostapenko | 700/110 |
| 2010/0147078 A1* | 6/2010 | Wilby et al. | 73/579 |
| 2011/0094546 A1* | 4/2011 | Valcore et al. | 134/137 |

FOREIGN PATENT DOCUMENTS
JP    05-315433    11/1993
* cited by examiner

*Primary Examiner* — Fernando L Toledo
(74) *Attorney, Agent, or Firm* — Stites & Harbison PLLC; Douglas E. Jackson

(57) ABSTRACT

Measuring apparatus and method for monitoring fabrication of a semiconductor wafer by exciting and measuring vibrations of the wafer substrate. A measurable parameter of vibration (e.g. frequency) is indicative of mass of a vibrating region. Mass change caused by wafer treatment is reflected in changes in vibration measurements taken before and after that treatment. The apparatus includes a wafer support e.g. projecting ledge (19), a vibration exciting device e.g. contact probe (28) or pressure differential applicator, and a measurement device e.g. frequency sensor (62).

21 Claims, 3 Drawing Sheets

MEASURING APPARATUS

TECHNICAL FIELD

The present invention relates to measuring apparatus for monitoring the fabrication process of a semiconductor wafer.

BACKGROUND TO THE INVENTION

Microelectronic devices are fabricated on semiconductor wafers using a variety of techniques, e.g. including deposition techniques (CVD, PECVD, PVD, etc) and removal techniques (e.g. chemical etching, CMP, etc). Semiconductor e.g. silicon wafers may be further treated in ways that alter their mass distribution e.g. by cleaning, ion implantation, lithography and the like. These treatment techniques typically cause a change in the mass distribution at or on the surface of the semiconductor wafer. The configuration of the changes to the surface are often vital to the functioning of the device, so it is desirable for quality control purposes to assess wafers during production in order to determine whether they have the correct configuration.

A number of existing measurement techniques are known. For etching treatment, one known technique is to break a treated wafer and perform a detailed analysis of its cross-section. If the analysis shows treatment to have been successful, it is assumed that the batch of wafers manufactured at the same time as the tested (broken) wafer also have the correct configuration. The disadvantage of this process is that the broken wafers cannot be used and are therefore wasted, and that the process is typically interrupted (i.e. fabrication stopped) every time a wafer from a batch is tested. Continuous production is therefore not feasible.

Other known measurement techniques depend on the type of treatment or the properties of materials created by the treatment. For example, treated wafers can be measured using ellipsometry when they contain dielectrics or wafers can be tested using resistivity probes when conductive metals are deposited thereon.

SUMMARY OF THE INVENTION

At its most general, the present invention provides an apparatus arranged to generate a set of values which represent properties of a semiconductor wafer which may change due to one or more treatment steps by exciting and measuring transverse vibrations of the substrate (e.g. bulk silicon base) at one or more measurement positions on the wafer. The theory of the invention treats each vibration position on the wafer as a mass on a spring. Wafer treatment processes (e.g. deposition or etching) can change the mass distribution across the wafer, i.e. at the vibration positions. The measured properties of the vibrations (e.g. frequency) may be representative of mass, such that a change in those properties can be representative of a change in mass.

Herein, vibration of the wafer is the oscillation of all or part of the substrate about an equilibrium (e.g. normal static) position.

According to a first aspect of the invention, there may be provided apparatus for monitoring a fabrication process of a semiconductor wafer, the apparatus including: a wafer support arranged to support the wafer; a vibration exciting device arranged to vibrate the wafer; and a measurement device for measuring the wafer vibrations at one or more measurement positions to determine one or more properties of the wafer.

For accurate measurements, it is desirable for the vibrating region to be well defined. The wafer support and/or vibration exciting device may therefore include means for defining one or more boundary conditions on the wafer which constrain the modes of vibration. For example, the wafer may be clamped around its periphery, whereby the vibration exciting device can be arranged to vibrate the whole wafer. Alternatively or additionally, localised sub-regions of wafer surface may be independently vibratable by being constrained within externally applied boundary conditions. For example, guard rings (preferably circular) may contact the underside of the wafer, i.e. a surface of the wafer without circuitry or chip components formed thereon, to create a condition of non-vibration at the contact point. The vibration exciting device may be arranged to excite vibrations of a sub-region of the wafer surface defined by the guard ring. The sub-region may be inside or outside the guard ring.

The guard rings may comprise a physical (mechanical) clamp, but preferably comprise a vacuum clamp. The means for defining one or more boundary conditions may be provided on the wafer support. They may include a point or line support for forming a node (non-vibration condition) on the wafer.

Likewise, the vibration exciting means preferably includes a pressure differential applicator arranged to create a pressure difference between opposite surfaces of the wafer. For example, one surface may be exposed to positive (e.g. atmospheric or more) pressure or the opposite surface to a negative (e.g. vacuum) pressure. The pressure difference is preferably selected to deform the wafer over the region that it is applied, whereby upon release (or partial release) of the pressure difference the region oscillates (vibrates) due to its inherent elastic properties. The vibration exciting means may therefore operate in a non-contact manner.

Preferably, a space beneath the vibrating portion of the wafer is chosen such that its resonant (Helmholtz) frequency is far removed from the typical vibration frequencies of the semiconductor wafer.

To improve the region edge boundary condition, the guard rings may define vacuum wells within or surrounding the boundary they define. Preferably, separate vacuum sources are used for the vibration excitation and the boundary condition formation.

Preferably, the vibration exciting device is arranged to excite vibrations at a plurality of localised measurement positions. There may therefore be a plurality of guard rings e.g. arranged to measure vibrations simultaneously. Alternatively, there may be a single guard ring and the apparatus may be arranged to control relative movement between the guard ring and the wafer to allow different measurement positions (regions) to be excited in sequence.

Preferably, the apparatus is arranged to monitor the change in mass distribution of a semiconductor wafer caused by one or more treatment steps in the fabrication process. A change in the total mass of the wafer can also be detected using this technique.

Herein, wafer treatment covers any process that alters the mass (usually at the surface) of the semiconductor wafer. Preferably, wafer treatment includes deposition processes (CVD, PECVD, PVD, etc) and etching (material removal) processes (including wet etching, dry etching and CMP).

Preferably, measurements are taken before and after wafer treatment so that a mass difference caused by treatment can be detected.

The detected mass difference may be presented as variations in the wafer treatment layer thickness, e.g. by assigning a predetermined density to the wafer treatment layer to convert mass differences into thickness differences.

The present invention may be adaptable to provide a wafer measurement technique for monitoring mass distribution of a wafer that is applicable to all types of wafer treatment. Preferably, it is implemented in a continuous process without the need to break treated wafers. Preferably, it is implemented on product wafers.

The apparatus may include a processor arranged to convert the measured vibrations into mass values. However, a detected parameter of the vibrations themselves may be the parameter used for monitoring, i.e. the success of wafer treatment may be represented by a predetermined change in a particular detected parameter.

It may be desirable to obtain information about the change in mass at the edge of a wafer, as this is typically the place where the largest errors can occur. Thus, the vibration exciting device may be arranged to constrain a central area of the wafer and vibrate a peripheral area.

Although the non-contact vibration exciting device mentioned above is preferred, in an alternative arrangement the vibration exciting device may contact the surface of the wafer. Thus, the vibrations in the wafer can be directly generated e.g. through contact of a mechanically vibrating member or through acoustic coupling.

The wafer support is preferably arranged to support the wafer without imparting internal stresses or strains on it which may affect the vibration frequencies. Preferably, the wafer support comprises a housing having a ledge for the outer edge of the wafer to rest thereon.

The ledge may include a vacuum clamp or other boundary condition defining means. The housing is preferably arranged to support the wafer in a substantially horizontal orientation.

The ledge defines an aperture through which the vibration exciting device may act, e.g. by way of pressure (non-contact) or by way of a physical probe which is insertable to contact an underside of the wafer.

Typically, semiconductor wafers have a substantially circular form, so that the wafer support preferably has an annular ledge for supporting the periphery of the wafer.

The semiconductor wafers described in the present application may be conventional, and typically comprise a substrate layer which undergoes treatment which e.g. involves depositing or etching various materials on one or more surfaces of the substrate. Silicon may be used in the manufacturing of the substrate. Preferably, the vibration exciting device is arranged to cause vibrations in the substrate.

The vibration exciting device may include a vibratable contact probe arranged to contact a point on the wafer in order to transmit vibrations into the wafer. The vibratable contact probe may be locatable at one of the measurement positions, and the vibration exciting device preferably includes means for bringing the probe into contact with the wafer. The vibration exciting device may include a driving mechanism connected to the vibratable contact probe and arranged to transmit transverse vibrations through the probe into the wafer.

There may be a contact probe provided at each measurement position. Alternatively, the vibration exciting device may include a movement mechanism for transferring an e.g. single contact probe between each of the plurality of measurement positions. Thus, the vibrations may be excited in each measurement position sequentially. Preferably, the movement mechanism includes a tracking device, so that the positional relationship between the wafer support and probe (and therefore between the supported wafer and the probe) can be accurately determined.

Preferably, the wafer support is adapted to receive the wafer in a predetermined orientation. This may permit the location of the vibration excitation device with respect to the wafer as a whole or with respect to a fabricated pattern on the surface of the wafer to be known. For example, the wafer support may have protrusions which are receivable in notches formed in the wafer. Alternatively or additionally, the alignment of the wafer on the wafer support may be adjustable e.g. finely tuned by positioning the fabricated or partially fabricated pattern on the wafer (i.e. using the wafer topography) at a predetermined orientation or location. Aligning the wafer can ensure that measurement taken before and after one or more treatment steps occur at the same location on the same wafer.

The tracking mechanism may be based on a two dimensional linear scale (e.g. x,y coordinates) or on a two dimensional radial system (e.g. $r,\theta$ coordinates).

The number and configuration of measurement positions may be chosen dependent on the detail of measurement required. Preferably there are at least five localised measurement positions, more preferably nine or more. For example, a plurality of measurement positions may be provided in one of the following configurations:

five points (one in the centre, four near the edge in a "+" shape), nine points (as above with four extra points half way along each arm of the "+"), or multiple points (e.g. in an orthogonal grid pattern) to provide a map of the whole wafer area.

Preferably, the measurement device is arranged to detect a time-varying parameter of the vibrations at each measurement position. Preferably, the measurement device is arranged to detect displacement of the wafer over time or the frequency of the vibrations. Other measurement methods are also feasible, e.g. measuring the velocity or acceleration of the wafer during its vibrations.

The measurement device may comprises a non-contact sensor, e.g. an interferometric or capacitive sensor or, preferably, an optical or laser triangulation sensor adapted to detect reflections of a light or laser beam incident on a reflective surface of the wafer. During vibration, the flexing of the wafer preferably deflects the reflections. Thus, one method of detection may include detecting the frequency of deflected light passing through a predetermined region, thereby allowing the frequency of vibration to be determined. Another method of detection may include detecting the variation of the displacement of one or more portions of the wafer over time. In one embodiment, the whole wafer may be vibrated and the time variation of displacement of the wafer detected at a one or more measurement positions. The normal modes of oscillation may then be deconvoluted using Fourier analysis to obtain the frequency of those vibrations.

Alternatively, the measurement device may include a contact probe arranged to contact a point on the wafer at each measurement position to measure vibrations in the wafer excited by the vibration exciting device. The contact probe may be brought into contact with the wafer after the vibrations have been excited, or may already be in position when the vibrations are being produced. The measurement device contact probe and the vibratable contact probe may be formed in a single probe with dual functionality. The single probe may therefore have two operation modes: a first (vibration) mode, where the probe contacts the wafer and transfers vibrations to it, and a second (measurement) mode where the probe ceases vibration and instead measures the vibrations of the wafer. In this case, the measurement device may be mounted on a movement mechanism similar to that described above for transferring the contact probe between measurement positions. The measurement device and the vibration exciting means may share the same movement mechanism.

The apparatus may include an assessment device arranged to receive information relating to the location of each measurement position and information relating to the oscillations at each measurement position. For example, the displacement of the measurement position over time detected by the non-contact sensor may be provided to the assessment device. The assessment device may be arranged to determine a mass distribution from the measured frequency values.

Preferably, the processing unit includes a non-uniformity profile generator arranged to calculate a non-uniformity profile for the wafer based on the determined mass distribution (or difference in mass distribution).

The calculated difference in mass distribution may be converted into a notional thickness by assigning a predetermined density to the wafer or to a region of the wafer at each measurement position. The profile may comprise a set of thicknesses values for predetermined points on the wafer. For example, thickness values for five or nine points arranged in a "+" configuration across two perpendicular diameters of the wafer may be provided.

The non-uniformity profile generator may be arranged to generate a visual representation of the calculated mass distribution.

In another aspect, the present invention may provide a method of monitoring a mass distribution of a semiconductor wafer during a fabrication process, the method including: supporting the wafer on a wafer support; vibrating the wafer; and measuring the vibrations at one or more measurement positions. For example, the frequency of the vibrations may be detected. Alternatively, the vibrations may be measured by detecting the displacement over time of the wafer at the measurement positions.

As explained above, the vibrations are preferably localised by applying boundary conditions (e.g. constraints on vibration) to areas of the wafer.

Preferably, the method includes obtaining a difference in mass distribution by comparing measurements taken before and after wafer treatment. Thus, the method may include exciting and measuring a frequency of localised vibrations at a plurality of measurement positions on the substrate before wafer treatment, exciting and measuring a frequency of localised vibrations at a plurality of measurement positions on the substrate after wafer treatment, and comparing the measurement results.

BRIEF DESCRIPTION OF THE DRAWINGS

An example of the present invention will now be described in detail with reference to the accompanying drawings, in which.

DETAILED DESCRIPTION; FURTHER OPTIONS AND PREFERENCES

Figure 1:
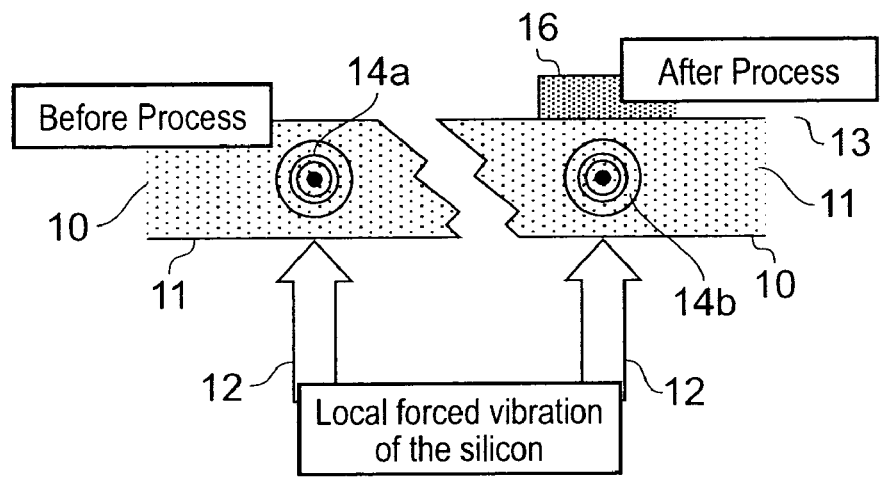
FIG. 1 illustrates schematically the principle of the present invention.

FIG. 1 depicts the principle of the present invention. A silicon substrate 10 is manufactured to be suitable for treatment to produce a semiconductor wafer. The treatment typically includes physical or chemical deposition of layers of semiconductor material optionally followed by etching of those layers e.g. to create a patterned surface. The left-hand side of FIG. 1 illustrates the silicon substrate 10 before treatment. A force 12 is applied to deform a measurement region 11 of the substrate 10. When the force 12 is released, the inherent elasticity of the substrate 10 permits vibrations 14a to propagate in the measurement region 11. The right hand side of FIG. 1 illustrates the silicon substrate 10 after treatment, where it includes a layer 16 of semiconductor material deposited on its upper surface 13. The force 12 is applied to deform the same measurement region in an identical manner, whereby vibrations 14b are excited in the substrate 10. The frequency of the vibrations 14b excited in the treated substrate 10 is different from the frequency of vibrations 14a excited in the untreated substrate 10. The difference is related to the change in mass in the measurement region 11.

By taking a plurality of vibration frequency measurement at one or more measurement regions on a wafer before and after treatment, a set of measurements representative of the change in mass distribution of the wafer caused by treatment can be obtained. These measurements can then be processed and/or extrapolated to create a non-uniformity map for the substrate in question.

Figure 2:
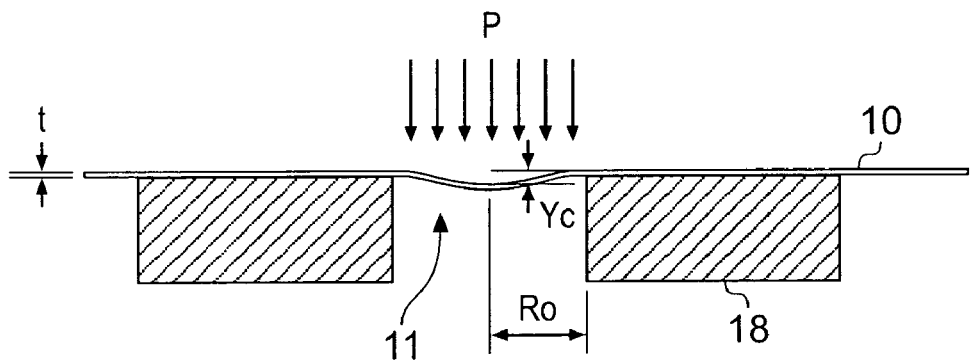
FIG. 2 shows the principle of deforming a measurement region of a wafer to excite vibrations.

To illustrate the theory, consider the case where the measurement region 11 is circular. FIG. 2 shows a cross-section view through a wafer 10 where a circular measurement region 11 on the wafer 10 is defined by a wafer support 18. The portion of the wafer 10 in the measurement region 11 can be thought of as a flexible diaphragm. The frequency of oscillation f for such a diaphragm may be expressed as $$f = \frac{kt}{R_0^2} \sqrt{\frac{E}{\rho(1-v^2)}}, \qquad 1$$

where k is the vibration mode constant (=0.467 for a diaphragm as illustrated), t is the thickness of the wafer, $R_0$ is the radius of the measurement region (vibratable diaphragm), E is the Young's modulus of the wafer, $\rho$ is the density of the wafer and v is the Poisson's ratio. There is therefore clearly a relationship between the mass m of the measurement region and the frequency since m is approximately $$m = \rho \pi R_0^2 t. \qquad 2$$

If a pressure difference P is applied across the wafer at the measurement region, an initial deformation Y of the diaphragm can be expressed as $$Y = \frac{PR_0^4(1-v^2)}{16t^3 E}. \qquad 3$$

This initial deflection distance and the frequency of vibration that occurs after the pressure is released can be measured to give a direct comparison of mass per unit area M ($=\rho t$) of the measurement region before and after treatment, since when the same pressure difference P is applied before and after, equations 1 and 3 can be manipulated to give $$\frac{M_1}{M_2} = \frac{f_1^2 Y_1}{f_2^2 Y_2}, \qquad 4$$

where the subscripts 1 and 2 indicate measurements made before and after treatment respectively.

Figure 3:
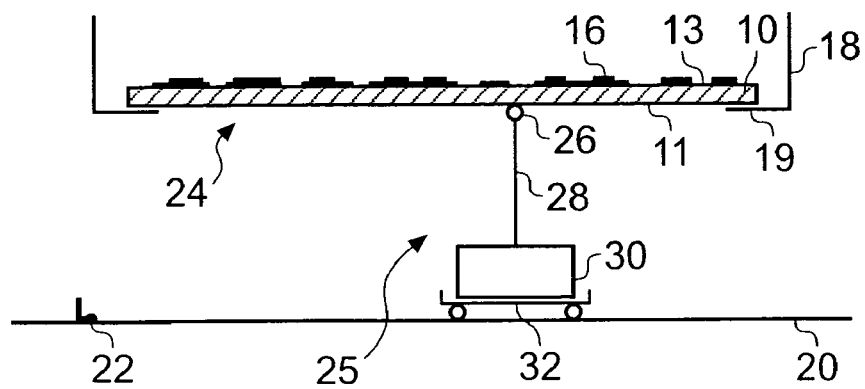
FIG. 3 shows a side view of measuring apparatus which is an embodiment of the invention.

FIG. 3 shows apparatus for measuring the frequency of vibrations in a treated semiconductor wafer. As shown in FIG. 1, the treated semiconductor wafer comprises a silicon substrate 10 with deposits 16 of semiconductor material on its upper surface 13. The wafer is held in a horizontal orientation on a wafer support 18, which comprises a projecting ledge 19 on which the periphery of the wafer rests, the ledge 19 defining an aperture 24 through the support 18 whereby a measurement region 11 of the wafer is exposed. The ledge may be in communication with a vacuum pump (not shown) for constraining the wafer periphery against vibration, as explained below.

The support 18 is disposed above a surface 20 on which a vibration exciting device 25 is movably mounted. The vibration exciting device 25 comprises a probe 28 which extends upwards towards the support 18 and has a contact tip 26 which contacts the underside of the wafer through the aperture 24 when the wafer is supported on the support 18. The probe 28 is mounted on a driver 30, which is arranged to push the contact tip 26 against a point in the measurement region 11 to deform the substrate 10. The driver 30 then quickly retracts the probe 28, whereby the substrate oscillates.

A frequency detector (not shown, but discussed below) is arranged to detect the frequency of oscillation. This frequency can be used as a parameter indicative of mass distribution, e.g. to create a non-uniformity map for the wafer.

The vibration exciting device 25 is mounted on a movement mechanism 32 which is movable in two dimensions over the surface 20 in order for the contact tip 26 to touch different points on the underside of the substrate 10, e.g. to cause different modes of vibration. The movement mechanism 32 has a location determination device (not shown) that is able to calculate accurately its position relative to a reference point 22. The reference point 22 is fixed relative to the support 18. The support 18 includes a protrusion (not shown) which fix into a notch formed in the wafer 10 in a known manner to align the wafer 10 with the support 18. When aligned in this way, the wafer can then be rotated or translated into a desired position with respect to the vibration exciting device whereby the position of the contact tip 26 with respect to the on the underside of the wafer 10 is accurately known. This means that the same mode(s) of vibration can be excited before and after treatment to allow a comparison of oscillation frequencies before and after to the made.

Figure 4:
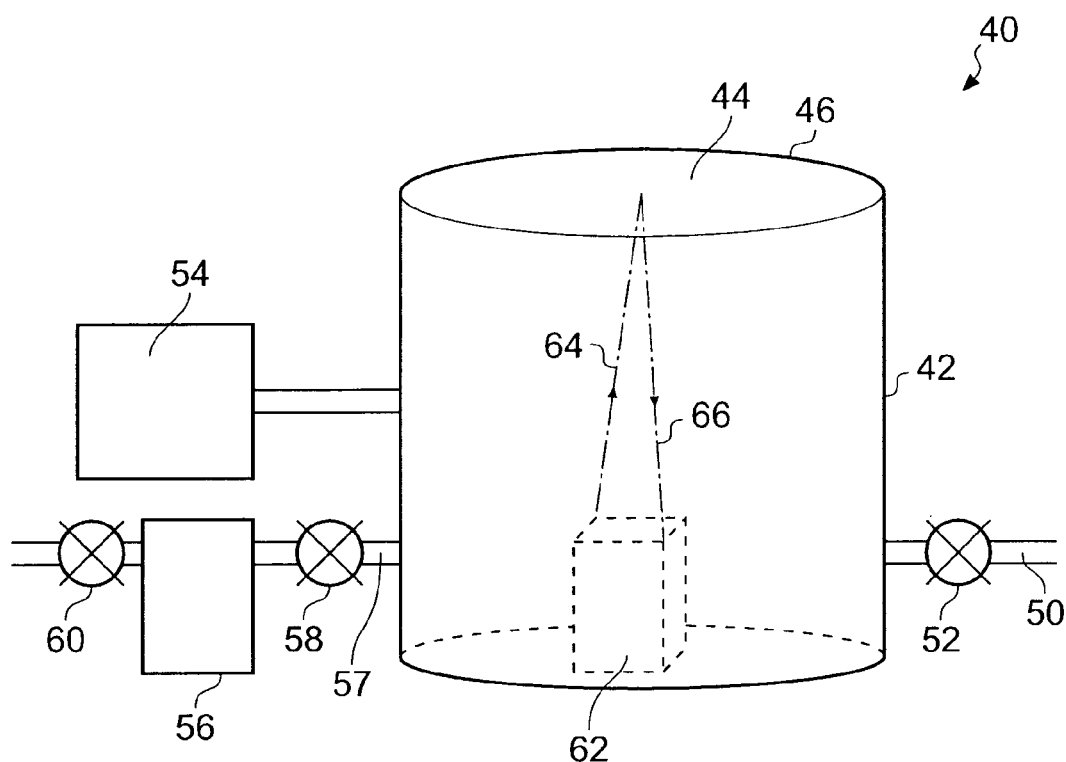
FIG. 4 a schematic view of measuring apparatus which is another embodiment of the invention.

FIG. 4 shows apparatus 40 for monitoring mass distribution changes of a semiconductor wafer that is another embodiment of the invention. The apparatus 40 comprises a cylindrical chamber 42 having an open top end 44 defined by an upper edge 46. The chamber is completely closed when a wafer or part of a wafer (not shown) lies over the open top end. In this embodiment, the part of the wafer that lies over the chamber 42 is the measurement region whose frequency of vibration is to be detected. The diameter of the chamber opening may therefore be selected according to the size of measurement region that it is desirable to measure. The diameter may be substantially equal to the diameter of the wafer, or it may be as small as 1 cm, e.g. where a plurality of measurements are to be taken on the surface of a wafer.

Figure 5:
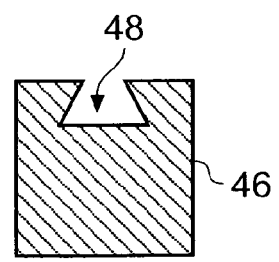
FIG. 5 shows a cross-sectional area through a vacuum clamp.

The measurement region is defined by clamping the upper edge 46 to the wafer to create a non-vibrating boundary condition. In this embodiment, the clamping is achieved by maintaining a residual pressure differential between opposite surfaces of the wafer. FIG. 5 shows a cross-section through the upper edge 46. A dovetail groove 48 is formed in the edge. The groove 48 holds a deformable o-ring (not shown) made for example from moulded perfluoro elastomer against which the wafer is sealed by the residual pressure difference.

The chamber 42 has a first outlet 50 which connects its interior to an evacuating vacuum pump (not shown) via a valve 52. The vacuum pump is operable to create a pressure difference between opposite surfaces of a wafer when the wafer is located over the opening 44. The residual pressure difference is maintained by in this way. However, the vacuum pump can increase the pressure difference to deform elastically the wafer.

The pressure in the chamber 42 is monitored by pressure sensor 54.

To excite vibration of the measurement region, a fixed volume 56 is fluidly connectable to a second outlet 57 of the chamber 42 via switchable valve 58. The fixed volume 56 can be exposed to atmospheric pressure via valve 60 when switchable valve 58 is closed. Vibrations can be excited in a controllable and repeatable fashion by opening switchable valve 58 and permit the fixed volume (e.g. at atmospheric pressure) to communicate with the evacuated chamber 42. The resultant pressure pulse causes the measurement region of the wafer to oscillate. The frequency of vibration is detected by frequency sensor 62, which is shown inside the chamber 42 in this embodiment. The frequency sensor 62 may be of any known type, e.g. a triangulating laser distance sensor or an optical focus sensor, wherein an incident beam 64 of radiation (e.g. light or laser beam) which reflects off the underside of the wafer (as reflection beam 66) causes properties in the sensor to change as the distance the beam travels varies. The sensor 62 may also detect a value for the initial deformation distance (Y in the equation above). Indeed, the pressure difference may be altered such that Y is the same for measurements taken before and after treatment to ensure the same vibration conditions apply. This may compensate for any changes in the spring constant k or Young's modulus E caused by wafer treatment. Alternatively, the change in deflection for identical pressure may be detected.

Figure 6:
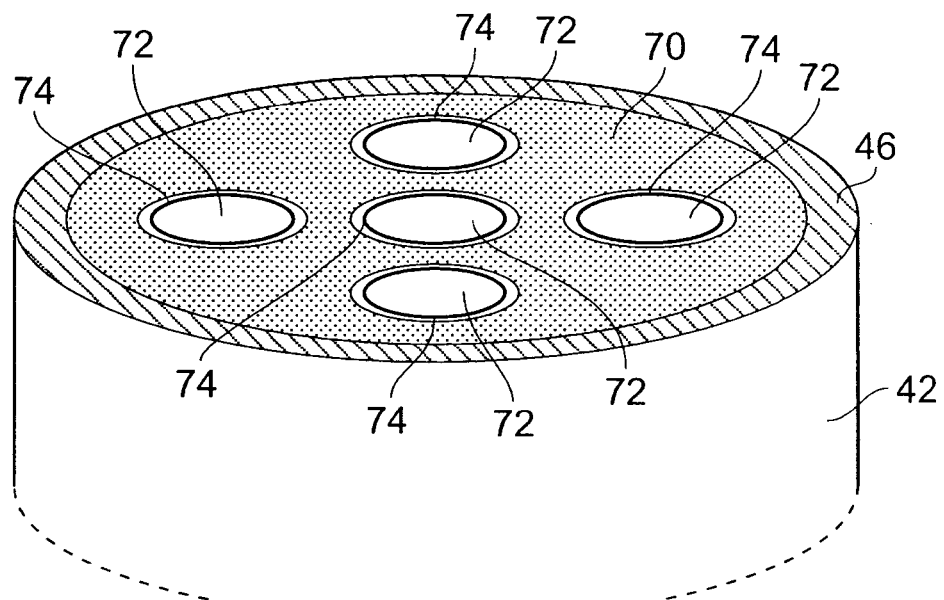
FIG. 6 shows a wafer support and a plurality of vacuum sinks for exciting vibrations.

The chamber 42 in FIG. 4 may be adapted to permit a plurality of measurement regions on a wafer to be vibrated. FIG. 6 shows an example of such an embodiment. The open end of chamber 42 is partially closed by plug 70 which defines five apertures 72 which open into the chamber itself. Each aperture is effectively a smaller version of the boundary condition defining upper edge 46 described above with reference to FIG. 4. Thus, the edge 74 of each aperture 72 is arranged to clamp the surface of a wafer that lies over it to define a non-vibration boundary condition which borders a vibratable measurement region overlying the aperture 72. The edges 74 may be high vacuum guard rings (vacuum clamps, described below) or dovetail grooves (described above) or may comprise small showerhead holes through which a relatively high vacuum acts to maintain the wafer in position on the apparatus.

Having a plurality of apertures for measurements on a single apparatus can speed up the measurement operation. Each aperture may have its own frequency sensor, e.g. to allow simultaneous vibration and frequency detection for two or more of the measurement regions. Alternatively, a single frequency sensor may work for all of the apertures. For example, the sensor may be movable in the base of the chamber. The measurement regions may therefore be measured sequentially, with time being saved by not having to reposition the wafer relative to the apparatus (i.e. release clamp vacuum) in between measurements.

Figure 7A:
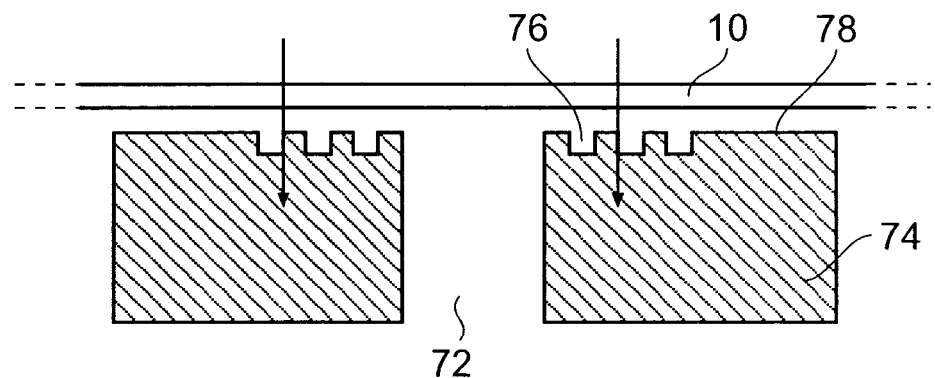
FIGS. 7(a) and 7(b) show a cross-sectional view through a wafer on a wafer support.
Figure 7B:
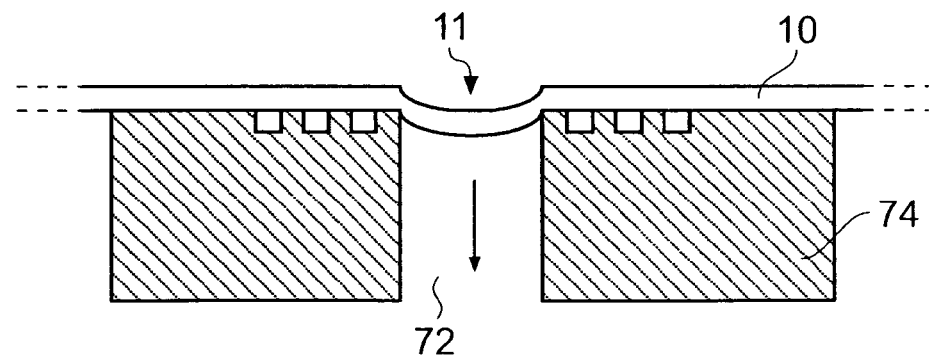

FIGS. 7(a) and 7(b) illustrate vacuum clamps for the embodiment shown in FIG. 6. A wafer 10 is lowered onto the edge 74 of an aperture 72. The edge 74 has annular square grooves 76 formed in its upper surface 78. The upper surface 78 is a rigid material. The grooves 76 are in fluid communication with a vacuum pump (not shown) which creates a strong pressure differential (e.g. up to 50 torr, e.g. $6.7 \times 10^3$ Pa) between opposite sides of the wafer at the grooves 76, thereby clamping the wafer 10.

FIG. 7(b) shows the wafer 10 fixed to the edge 74 with a negative pressure applied beneath the aperture 72. There is therefore a pressure difference on opposite sides of a measurement region 11 of the wafer 10. The pressure difference causes the wafer 10 to deform at the measurement region 11. Vibrations may be excited by removing (or at least partially reducing) the pressure difference.

The invention claimed is:

1. Apparatus for monitoring a fabrication process of a semiconductor wafer, the apparatus including:
    a wafer support arranged to support the wafer;
    a vibration exciting device arranged to vibrate the wafer; and
    a measurement device which measures the wafer vibrations at one or more measurement positions and which compares frequencies of the wafer vibrations measured by the measurement device before and after the wafer is subjected to one or more treatment steps in the fabrication process to determine one or more properties of the wafer.

2. Apparatus according to claim 1, wherein the wafer support and/or vibration exciting device includes a contact element for defining one or more boundary conditions on the wafer which constrain the modes of vibration.

3. Apparatus according to claim 2, wherein the contact element is arranged on the wafer support to clamp the wafer around its periphery.

4. Apparatus according to claim 2, wherein the contact element includes a guard ring arranged to contact the underside of the wafer to create independently vibratable localized sub-regions of wafer surface.

5. Apparatus according to claim 4, wherein the guard ring comprises a vacuum clamp.

6. Apparatus according to claim 1, wherein the vibration exciting device is arranged to excite vibrations at a plurality of localized measurement positions.

7. Apparatus according to claim 1, wherein the vibration exciting means includes a pressure differential applicator arranged to create a pressure difference between opposite surfaces of the wafer.

8. Apparatus according to claim 1, wherein the vibration exciting device includes a vibratable contact probe arranged to contact a point on the wafer in order to transmit vibrations into the wafer.

9. Apparatus according to claim 8, wherein the vibration exciting device includes a movement mechanism for transferring the contact probe between each of the plurality of measurement positions.

10. Apparatus according to claim 9, wherein the movement mechanism includes a tracking device arranged to determine the positional relationship between the wafer support and probe.

11. Apparatus according to claim 1 including a processor arranged to monitor the change in mass distribution of a semiconductor wafer caused by the one or more treatment steps in the fabrication process based on the measured wafer vibrations.

12. Apparatus according to claim 11, wherein the processor is arranged to convert the measured vibrations into mass values.

13. Apparatus according to claim 12, wherein the processor includes a non-uniformity profile generator arranged to calculate a non-uniformity profile for the wafer based on the determined change in mass distribution.

14. Apparatus according to claim 1, wherein the wafer support comprises a housing having a ledge for the outer edge of the wafer to rest thereon in a substantially horizontal orientation.

15. Apparatus according to claim 14, wherein the ledge defines an aperture through which the vibration exciting device is operable.

16. Apparatus according to claim 1, wherein the wafer support is adapted to receive the wafer in a predetermined orientation.

17. Apparatus according to claim 1, wherein the measurement device is arranged to detect a time-varying parameter of the vibrations at each measurement position.

18. Apparatus according to claim 17, wherein the measurement device includes a non-contact sensor.

19. A method of monitoring a mass distribution of a semiconductor wafer during a fabrication process where the wafer is subjected to one or more treatment steps, the method including the steps of:
    supporting the wafer on a wafer support;
    vibrating the wafer;
    measuring the frequency of vibrations at one or more measurement positions on the wafer; and
    comparing the frequencies of the wafer vibrations measured before and after the wafer is subjected to the one or more treatment steps in the fabrication process to obtain a difference in mass distribution caused by the one or more treatment steps in the fabrication process.

20. A method according to claim 19 including applying boundary conditions to areas of the wafer before vibrating the wafer.

21. A method of monitoring a mass distribution of a semiconductor wafer during a fabrication process, the method comprising:
    exciting and measuring a frequency of localized vibrations at a plurality of measurement positions on a wafer substrate before wafer treatment;
    treating the wafer;
    exciting and measuring a frequency of localized vibrations at a plurality of measurement positions on the substrate after wafer treatment; and
    comparing the before wafer treatment measurement results with the after wafer treatment measurement results.

* * * * *